US008785972B2

(12) United States Patent
Morishita

(10) Patent No.: US 8,785,972 B2
(45) Date of Patent: Jul. 22, 2014

(54) SEMICONDUCTOR ELECTROSTATIC PROTECTION CIRCUIT DEVICE

(71) Applicant: Renesas Electronics Corporation, Kawasaki (JP)

(72) Inventor: Yasuyuki Morishita, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 13/781,263

(22) Filed: Feb. 28, 2013

(65) Prior Publication Data

US 2013/0228824 A1    Sep. 5, 2013

(30) Foreign Application Priority Data

Mar. 2, 2012   (JP) ................. 2012-046825

(51) Int. Cl.
*H01L 29/66*   (2006.01)
*H01L 29/74*   (2006.01)

(52) U.S. Cl.
CPC .................... *H01L 29/74* (2013.01)
USPC ............ 257/173; 257/107; 257/355; 257/357; 257/350; 257/368; 438/133; 438/157; 438/270; 438/296; 361/101; 361/111; 361/56; 361/91.5

(58) Field of Classification Search
CPC ............ H01L 27/0255; H01L 27/0259; H01L 27/0262; H01L 29/7436; H01L 29/74
USPC ......... 257/107, 124, 140, 154, 173, 328, 355, 257/357, 358, 360, 362, 368, 409, 539, 257/561; 361/101, 111, 56, 91.5; 438/133, 438/157, 270, 296
See application file for complete search history.

(56) References Cited

U.S. PATENT DOCUMENTS 6,876,041 B2 *   4/2005   Lee et al. ................. 257/358
7,187,037 B2     3/2007   Morishita

* cited by examiner

*Primary Examiner* — Meiya Li
*Assistant Examiner* — Peter M Albrecht
(74) *Attorney, Agent, or Firm* — Womble Carlyle Sandridge & Rice, LLP

(57) ABSTRACT

An electrostatic protection circuit in a semiconductor device includes a first first-conductivity type well extending in a first direction over a semiconductor substrate, a second first-conductivity type well extending in a second direction over the semiconductor substrate and perpendicular to the first direction with one end coupled to a first long side of the first first-conductivity type well, and a second-conductivity type well formed around the first first-conductivity type well and the second first-conductivity type well. It also includes a first high-concentration second-conductivity type region extending in the second direction on a surface of the second first-conductivity type well and a first high-concentration first-conductivity type region extending in the second direction on a surface of the second-conductivity type well while facing the first high-concentration second-conductivity type region.

22 Claims, 7 Drawing Sheets

SEMICONDUCTOR ELECTROSTATIC PROTECTION CIRCUIT DEVICE

CROSS-REFERENCE TO RELATED APPLICATIONS

The disclosure of Japanese Patent Application No. 2012-046825 filed on Mar. 2, 2012 including the specification, drawings and abstract is incorporated herein by reference in its entirety.

BACKGROUND

The present invention relates to semiconductor devices and more particularly to semiconductor devices which have an electrostatic protection circuit.

With the evolution of the CMOS (Complementary Metal Oxide Semiconductor) process, constituent elements of a semiconductor integrated circuit have become more vulnerable to electrostatic discharge (ESD) and how to design the electrostatic protection circuit has become more important. A thyristor element (SCR: Silicon Controlled Rectifier) provides a high ESD protection performance per unit area and is known as an effective ESD protection element. However, for the thyristor element to demonstrate its performance potential, it is essential to design the thyristor element layout carefully.

Japanese Patent No. 4312696 describes the layout of a semiconductor device with a thyristor element as an electrostatic protection circuit as an example. In the electrostatic protection circuit described in Japanese Patent No. 4312696, two high-concentration P-type regions as thyristor element anodes are disposed in one N-type well (a thyristor element anode is hereinafter referred to as an "SCR anode"). Between the two SCR anodes, a high-concentration N-type region as a trigger TAP for connection with a trigger element is disposed. In addition, high-concentration N-type regions as thyristor element cathodes are disposed on the surfaces of P-type wells which face the two SCR anodes (a thyristor element cathode is hereinafter referred to as an "SCR cathode").

SUMMARY

The following analysis has been made by the present inventors.

FIG. 7 is a plan view showing the layout of the electrostatic protection circuit described in Japanese Patent No. 4312696. Referring to FIG. 7, the electrostatic protection circuit includes an N-type well NW11, and P-type wells PW10 and PW12 which are located on both sides of it. High-concentration P-type regions PP11a and PP11b are formed on the surface of the N-type well NW11. Also, a high-concentration N-type region NP11 as a trigger tap (trigger TAP) for connection with a trigger element is formed between the two SCR anodes. Furthermore, a high-concentration N-type region NP10 as an SCR cathode is formed on the surface of the P-type well PW10 in a way to face the SCR anode (high-concentration P-type region PP11a). Also, a high-concentration N-type region NP12 as an SCR cathode is formed on the surface of the P-type well PW12 in a way to face the SCR anode (high-concentration P-type region PP11b).

In the electrostatic protection circuit shown in FIG. 7, when a voltage higher than a given level is applied to the trigger element (not shown), trigger current $I_{trig}$ flows from the SCR anodes through the trigger TAP to the trigger element (not shown) as indicated by the dotted line arrows. Then the thyristor element is activated so that SCR current $I_{SCR}$ flows from the SCR anodes to the SCR cathodes as indicated by the solid line arrows.

In order to increase the ESD breakdown voltage, the thyristor element effective width (W) must be increased. Here, "thyristor element effective width" refers to the sum of opposing side lengths of pairs of SCR anodes and SCR cathodes. In the electrostatic protection circuit shown in FIG. 7, there are two pairs of SCR anodes and SCR cathodes. Therefore, when the length of the opposing side of the SCR anode and SCR cathode is expressed as L, the thyristor element effective width W is 2 L (W=2 L).

According to the semiconductor integrated device described in Japanese Patent 4312696, it is difficult to make the long side dimension (vertical dimension in FIG. 7) in the layout of the electrostatic protection circuit not more than a given value (for example, about 30 μm). Specifically, the freedom in the aspect ratio of the thyristor element layout is low, so the long side of the layout may be large, leading to an increase in the layout area.

Furthermore, according to the semiconductor integrated device described in Japanese Patent 4312696, since the trigger TAP is located in the center, at most two thyristor elements which include pairs of SCR anodes and SCR cathodes can be provided, one pair on either side of the trigger TAP.

Therefore, the issue to be tackled is to increase the freedom in the layout design of the electrostatic protection circuit without deterioration in thyristor element characteristics in a semiconductor device with a thyristor element as an electrostatic protection circuit. The above and further objects and novel features of the invention will more fully appear from the following detailed description in this specification and the accompanying drawings.

According to an aspect of the invention, a semiconductor device has an electrostatic protection circuit with a thyristor structure comprised of a high-concentration P-type region, N-type well, P-type well, and high-concentration N-type region, in which the N-type well has a first portion extending in a first direction and a second portion extending in a second direction with one end coupled to the first portion and the high-concentration P-type region is formed as an SCR anode on a surface of the second portion of the N-type well and a high-concentration N-type region is formed as an SCR cathode on a surface of the P-type well in a way to face the high-concentration P-type region.

According to the above aspect of the invention, the freedom in the layout design of the electrostatic protection circuit can be increased without deterioration in thyristor element characteristics.

DETAILED DESCRIPTION

Figure 1:
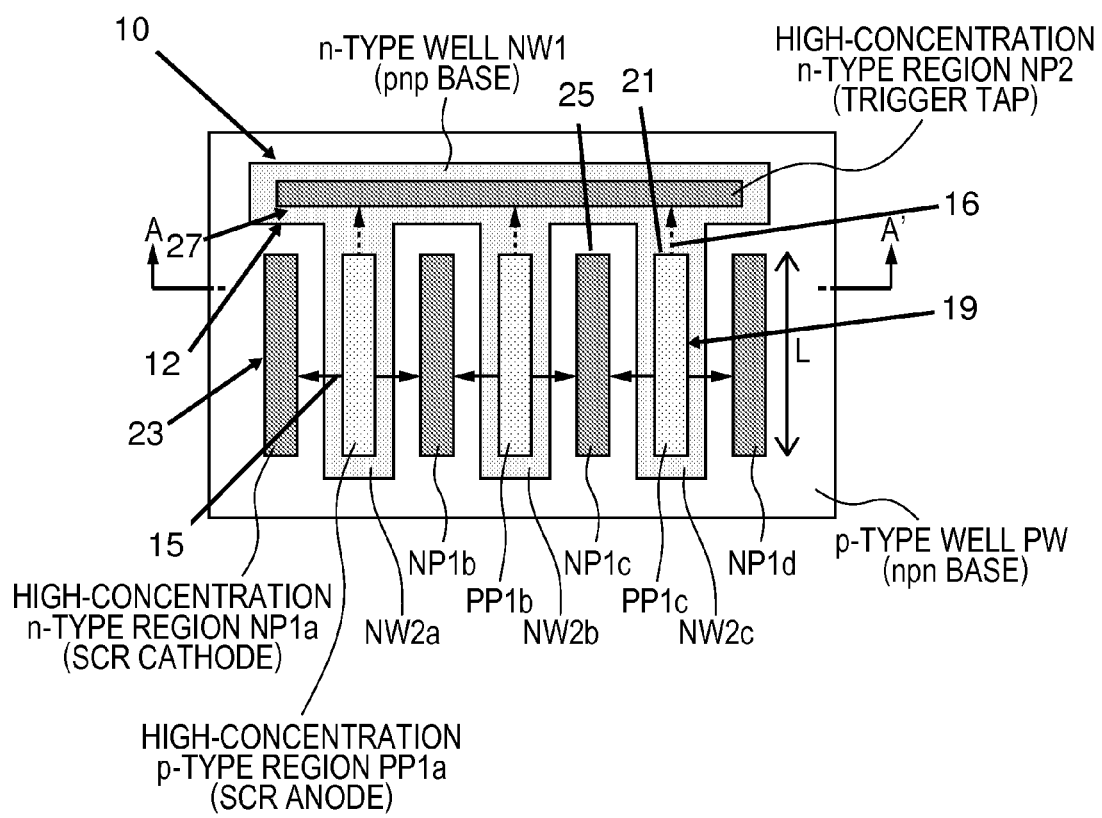
FIG. 1 is a plan view showing the layout of an electrostatic protection circuit in a semiconductor device according to a first embodiment of the invention.

First, an embodiment of the invention will be outlined below. The reference signs in the accompanying drawings are just examples which help the understanding of the invention and are not intended to limit the invention to what is shown in the drawings.

FIG. 1 is a plan view showing an example of the layout of an electrostatic protection circuit included in a semiconductor device. Referring to FIG. 1, the electrostatic protection circuit has a thyristor structure which includes high-concentration P-type regions, N-type wells, P-type well, and high-concentration N-type wells. The N-type wells, which include N-type wells NW1 and NW2a to NW2c, make up a comb-like shape and high-concentration P-type regions PP1a to PP1c as SCR anodes are formed on the surfaces of the N-type wells NW2a to NW2c respectively. In addition, on the surface of the P-type well PW, high-concentration N-type regions NP1a to NP1d as SCR cathodes are formed on both sides of the SCR anodes.

Figure 4:
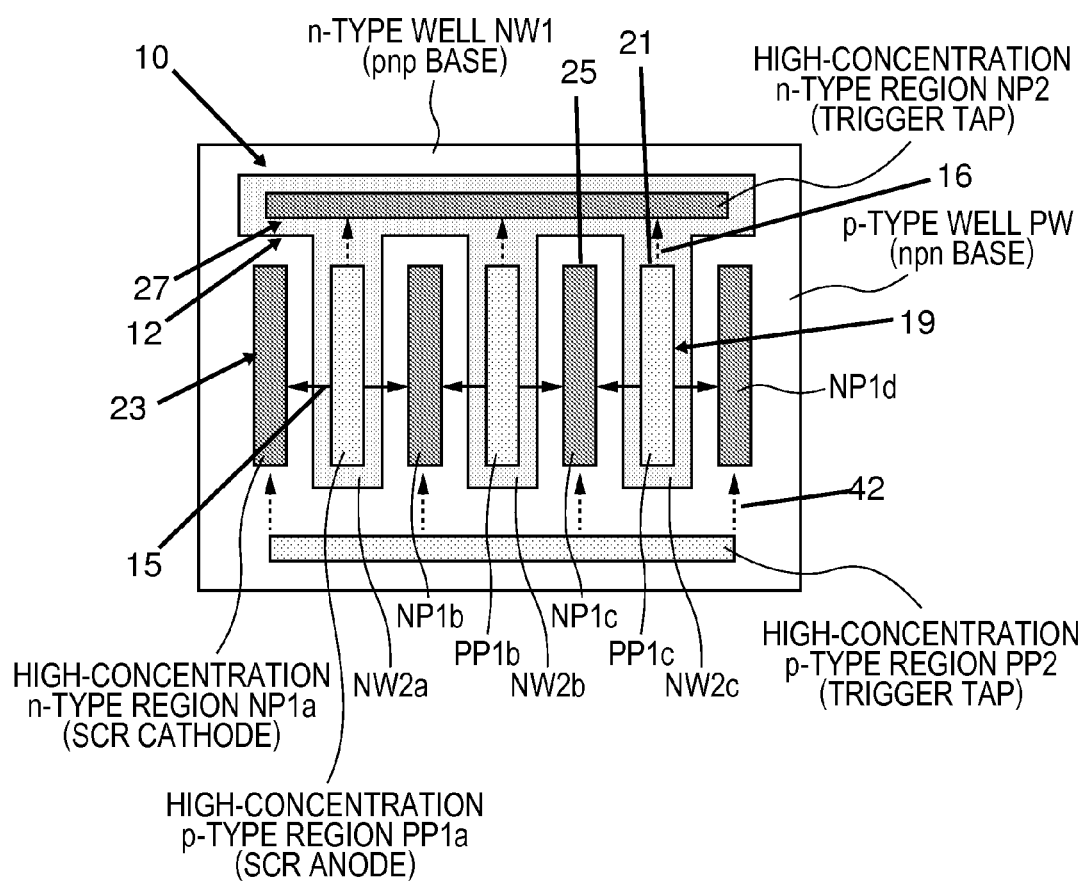
FIG. 4 is a plan view showing the layout of an electrostatic protection circuit in a semiconductor device according to a second embodiment of the invention.

Here, a high-concentration N-type region NP2 as a trigger TAP may be formed on the surface of the N-type well NW1. Also a high-concentration P-type region PP2 as a trigger TAP may be formed on the surface of the P-type well PW (FIG. 4).

As shown in FIG. 1, the N-type wells as the thyristor element PNP base make up a comb-like shape and a plurality of high-concentration P-type regions are disposed as SCR anodes on the surfaces of the N-type wells. As a trigger TAP, a high-concentration N-type region NP2 extends in the direction perpendicular to the long side direction of the SCR anodes PP1a, PP1b, PP1c on the surface of the corresponding, comb-like N-type wells NW2a, NW2b, NW2c. According to this layout, the number of SCR anodes and the number of SCR cathodes can be freely adjusted without deteriorating the thyristor element performance, thereby increasing the freedom in the aspect ratio of the layout shape. In addition, the layout area of the electrostatic protection circuit can be smaller than that of the electrostatic protection circuit described in Japanese Patent No. 4312696.

Referring to FIG. 1, the electrostatic protection circuit in the semiconductor device includes a first first-conductivity type well (N-type well NW1) extending in a first direction (horizontal direction in FIG. 1) over the semiconductor substrate, a second first-conductivity type well (N-type well NW2a) extending in a second direction (vertical direction in FIG. 1) over the semiconductor substrate and perpendicular to the first direction. One end of the second first-conductivity type well (N-type well NW2a) is coupled to the second long side 12 of the first first-conductivity type well (N-type well NW1). The electrostatic protection circuit also includes, a second-conductivity type well (P-type well PW) formed around the first first-conductivity type well (N-type well NW1) and the second first-conductivity type well (N-type well NW2a), a first high-concentration second-conductivity type region (high-concentration P-type region PP1a) extending in the second direction (vertical direction in FIG. 1) on the surface of the second first-conductivity type well (N-type well NW2a), and a first high-concentration first-conductivity type region (high-concentration N-type region NP1a) extending in the second direction (vertical direction in FIG. 1) on the surface of the second-conductivity type well (P-type well PW) while facing, and extending parallel to, the first high-concentration second-conductivity type region (high-concentration P-type region PP1a). In addition, as seen in FIG. 1, the first high-concentration first-conductivity type region has approximately the same length L as the first high-concentration second-conductivity type region.

Referring to FIG. 1, preferably the electrostatic protection circuit should have the second high-concentration first-conductivity type region (high-concentration N-type region NP2) extending in the first direction (horizontal direction in FIG. 1) on the surface of the first first-conductivity type well (N-type well NW1) as the first trigger tap region.

The electrostatic protection circuit may have a plurality of second first-conductivity type wells, first high-concentration second-conductivity type regions, and first high-concentration first-conductivity type regions. Referring to FIG. 1, a plurality of N-type wells NW2a to NW2c are formed as the second first-conductivity type wells, a plurality of high-concentration P-type regions PP1a to PP1c are formed as the first high-concentration second-conductivity type regions and a plurality of high-concentration N-type regions NP1a to NP1d are formed as the first high-concentration first-conductivity type regions.

In this semiconductor device, if the SCR element effective width is the same, the layout area of the electrostatic protection circuit can be much smaller than that of the electrostatic protection circuit described in Japanese Patent No. 4312696. In the case of the electrostatic protection circuit described in Japanese Patent No. 4312696 (FIG. 7), the high-concentration N-type region as a trigger TAP is formed between the SCR anodes and the number of pairs of SCR anodes and SCR cathodes is limited to 2. In the case seen in FIG. 7, the thyristor element effective width W is 2 L (W=2L).

On the other hand, in the case shown in FIG. 1, the high-concentration N-type region as a trigger TAP is formed on the surface of the N-type well NW1, so the number of pairs of SCR anodes and cathodes is 6. In the case of FIG. 1, the thyristor element effective width W is 6 L (W=6 L). Therefore, if the thyristor element effective width is the same, in the layout in FIG. 1 the vertical dimension can be remarkably reduced and the layout area can also be remarkably reduced as compared with the electrostatic protection circuit described in Japanese Patent No. 4312696.

As shown in FIG. 1, when the high-concentration N-type region as a first trigger TAP is formed on the surface of the N-type well NW1 and extends in a first direction perpendicular to the SCR anodes PP1a, PP1b, PP1c, the SCR cathodes NP1a, NP1b, NP1c, NP1d can be formed in a way to face, and extend parallel to for the same extent, both long sides 19 of each SCR anode. Thus, the long sides 19 of each SCR anode PP1a, PP1b, PP1c faces a long side 23 of an SCR cathode NP1a, NP1b, NP1c, NP1d. Meanwhile, a first short side 21 of each SCR anode PP1a, PP1b, PP1c and a first short side 25 of each SCR cathode NP1a, NP1b, NP1c, NP1d faces a long side 27 of the high-concentration N-type region which is configured to serve as a first trigger TAP. As seen in FIG. 1, the SCR cathodes NP1a, NP1b, NP1c extend in the second direction (vertical direction) which is perpendicular to the first direction (horizontal direction) along which the N-type well NW1 extends. In this case, a desired number of SCR anodes and SCR cathodes can be formed, so the freedom in the layout design of the electrostatic protection circuit is increased.

FIG. 4 is a plan view showing an example of the layout of the electrostatic protection circuit in the semiconductor device. Referring to FIG. 4, preferably the electrostatic protection circuit has a second high-concentration second-conductivity type region (high-concentration P-type region PP2)

as a second trigger tap region which extends in a first direction (horizontal direction in FIG. 4) in a way to face, and extend parallel to, the second high-concentration first-conductivity type region (high-concentration N-type region NP2) on the surface of the second-conductivity type well (P-type well PW), with the second first-conductivity type wells (N-type wells NW2a to NW2c) being located between the first trigger tap region NP2 and the second trigger tap region PP2.

This structure ensures that the turn-on operation of the thyristor element is uniform in the vertical direction in FIG. 4, so the performance as the ESD protection element is higher than in the structure shown in FIG. 1.

Figure 5:
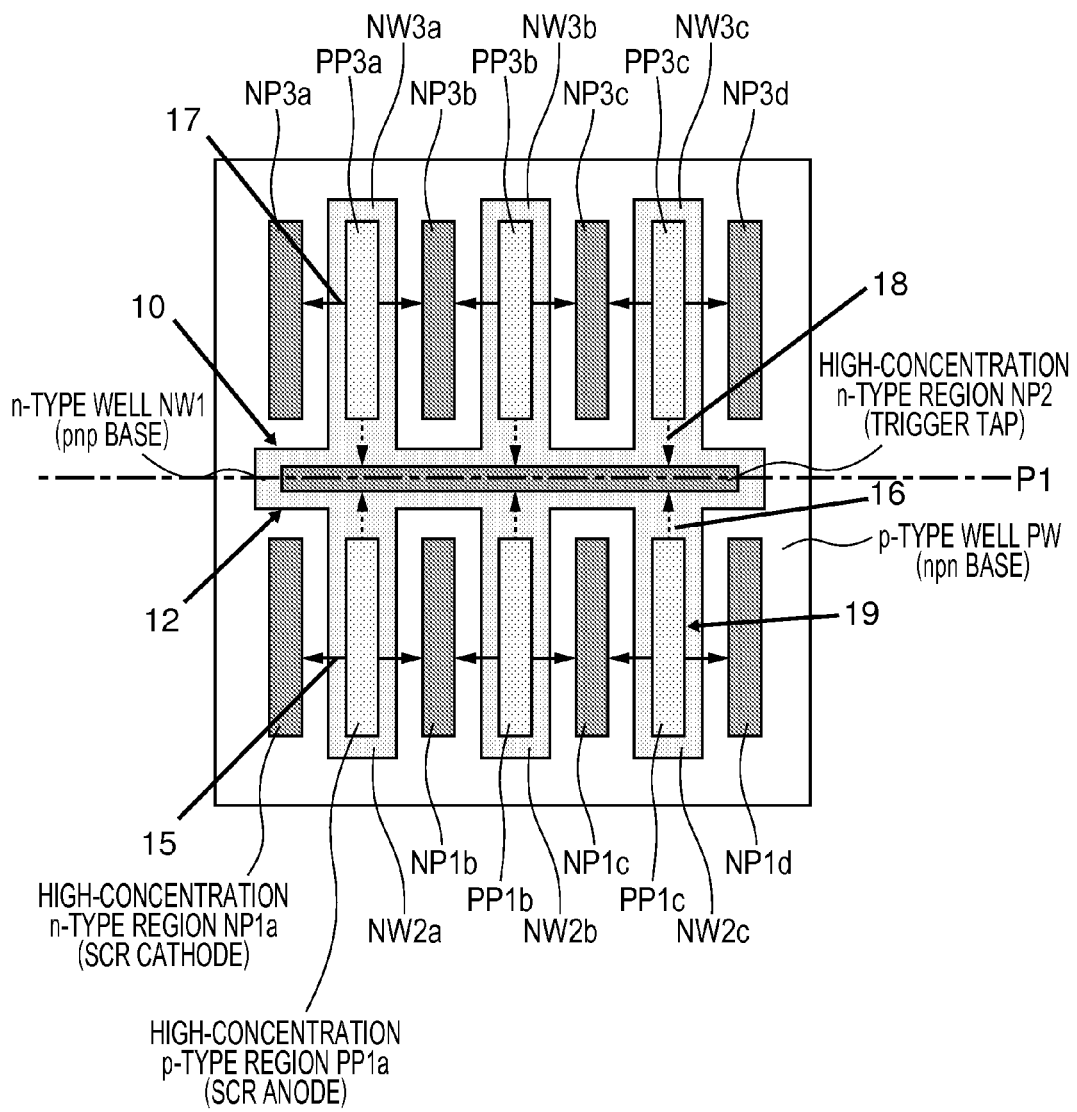
FIG. 5 is a plan view showing the layout of an electrostatic protection circuit in a semiconductor device according to a third embodiment of the invention.

FIG. 5 is a plan view showing an example of the layout of the electrostatic protection circuit in the semiconductor device. Referring to FIG. 5, the electrostatic protection circuit extends in the second direction (vertical direction in FIG. 5) and includes a third first-conductivity type well (N-type well NW3a) with one end coupled to a first long side 10 (the upper long side as seen in FIG. 5) of the first first-conductivity type well (N-type well NW1) which differs from the second long side 12 coupled to the second first-conductivity type wells (N-type wells NW2a to NW2c), a third high-concentration second-conductivity type region (high-concentration P-type region PP3a) extending in the second direction (vertical direction in FIG. 5) on the surface of the third first-conductivity type well (N-type well NW3a), and a third high-concentration first-conductivity type region (high-concentration N-type region NP3a) extending in the second direction (vertical direction in FIG. 5) on the surface of the second-conductivity type well (P-type well PW) while facing, and extending parallel to for the same length as, the third high-concentration second-conductivity type region (high-concentration P-type region PP3a). Here, the second-conductivity type well (P-type well PW) is formed around the first first-conductivity type well (N-type well NW1), second first-conductivity type well (N-type wells NW2a to NW2c), and third first-conductivity type well (N-type well NW3a). As seen in FIG. 5, this results in the electrostatic protection circuit having minor symmetry about a line P1 extending in the first direction (horizontal direction) through the N-type well NW1 and the high-concentration N-type region NP2.

The electrostatic protection circuit may have a plurality of second first-conductivity type wells, first high-concentration second-conductivity type regions, first high-concentration first-conductivity type regions, third first-conductivity type wells, third high-concentration second-conductivity type regions, and third high-concentration first-conductivity type regions. Referring to FIG. 5, below the N-type well NW1 as seen in the figure, a plurality of N-type wells NW2a to NW2c are formed as second first-conductivity type wells, a plurality of high-concentration P-type regions PP1a to PP1c are formed as first high-concentration second-conductivity type regions, and a plurality of high-concentration N-type regions NP1a to NP1d are formed as first high-concentration first-conductivity type regions. On the other hand, above the N-type well NW1 as seen in the figure, a plurality of N-type wells NW3a to NW3c are formed as third first-conductivity type wells, a plurality of high-concentration P-type regions PP3a to PP3c are formed as third high-concentration second-conductivity type regions, and a plurality of third high-concentration N-type regions NP3a to NP3d are formed as third high-concentration first-conductivity type regions.

According to this semiconductor device, the thyristor element formed above the N-type well NW1 and the thyristor element formed below the N-type well NW1 can share the trigger TAP (high-concentration N-type region NP2) in the center. Therefore, it is possible to decrease the size in the vertical direction in FIG. 5 while maintaining the performance of the electrostatic protection circuit.

Figure 6:
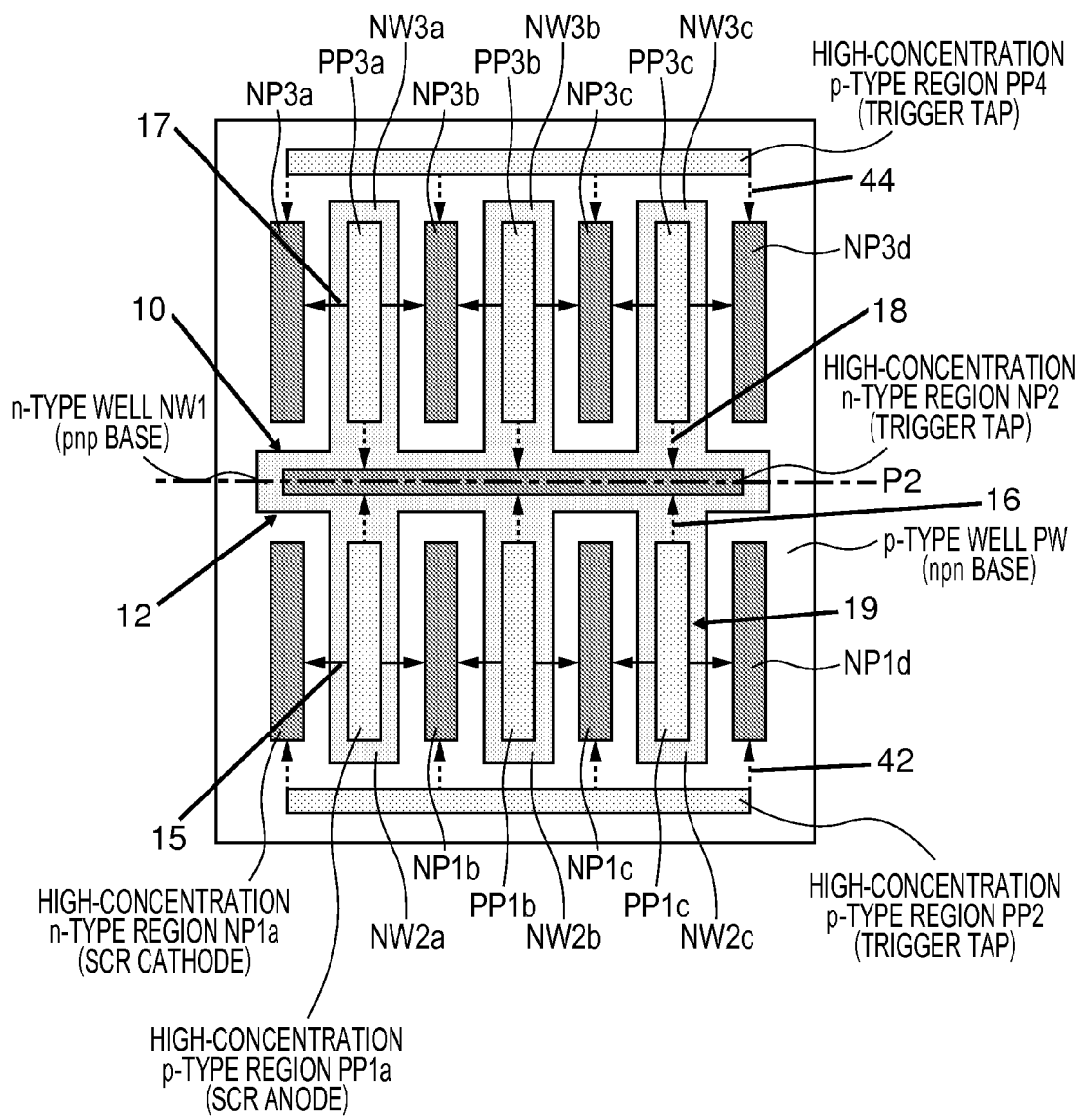
FIG. 6 is a plan view showing the layout of an electrostatic protection circuit in a semiconductor device according to a fourth embodiment of the invention.

FIG. 6 is a plan view showing an example of the layout of the electrostatic protection circuit in the semiconductor device. Referring to FIG. 6, preferably the electrostatic protection circuit has a second high-concentration second-conductivity type region (high-concentration P-type region PP2) as a second trigger tap region which extends in a first direction (horizontal direction in FIG. 6) in a way to face, and extend parallel to, the second high-concentration first-conductivity type region (high-concentration N-type region NP2) on the surface of the second-conductivity type well (P-type well PW) with the second first-conductivity type wells (N-type wells NW2a to NW2c) between them, and also has a fourth high-concentration second-conductivity type region (high-concentration P-type region PP4) as a third trigger tap region which extends in the first direction (horizontal direction in FIG. 6) in a way to face, and extend parallel to, the second high-concentration first-conductivity type region (high-concentration N-type region NP2) on the surface of the second-conductivity type well (P-type well PW) with the third first-conductivity type wells (N-type wells NW3a to NW3c) between them. As seen in FIG. 6, this results in the electrostatic protection circuit having minor symmetry about a line P2 extending in the first direction (horizontal direction) through the N-type well NW1 and the high-concentration N-type region NP2.

This structure ensures that the turn-on operation of the thyristor element is uniform in the vertical direction in FIG. 6, so the performance as the ESD protection element is higher than in the structure shown in FIG. 5.

First Embodiment

The semiconductor device according to the first embodiment will be described referring to drawings. FIG. 1 is a plan view showing the layout of the electrostatic protection circuit in the semiconductor device according to this embodiment. Referring to FIG. 1, the electrostatic protection circuit has N-type wells (PNP base), including N-type wells NW1 and NW2a to NW2c, arranged in a comb-like pattern. A plurality of high-concentration P-type regions PP1a to PP1c as SCR anodes are formed on the surfaces of the N-type wells NW2a to NW2c respectively. High-concentration N-type regions NP1a to NP1d as SCR cathodes are formed on both sides of the SCR anodes. Also, a high-concentration N-type region NP2, which extends in the direction perpendicular to the long side direction of the SCR anodes, is disposed as a trigger TAP for PNP on the surface of the N-type well NW1 among the N-type wells arranged in a comb-like pattern. The N-type well NW1 has a first long side 10 and a second long side 12 opposite the first long side 10. The first long side 10 faces away from the N-type wells NW2a to NW2c, while first ends of the N-type wells NW2a to NW2c are coupled at spaced apart locations to the second long side 12, thereby forming the comb-like structure.

Figure 2:
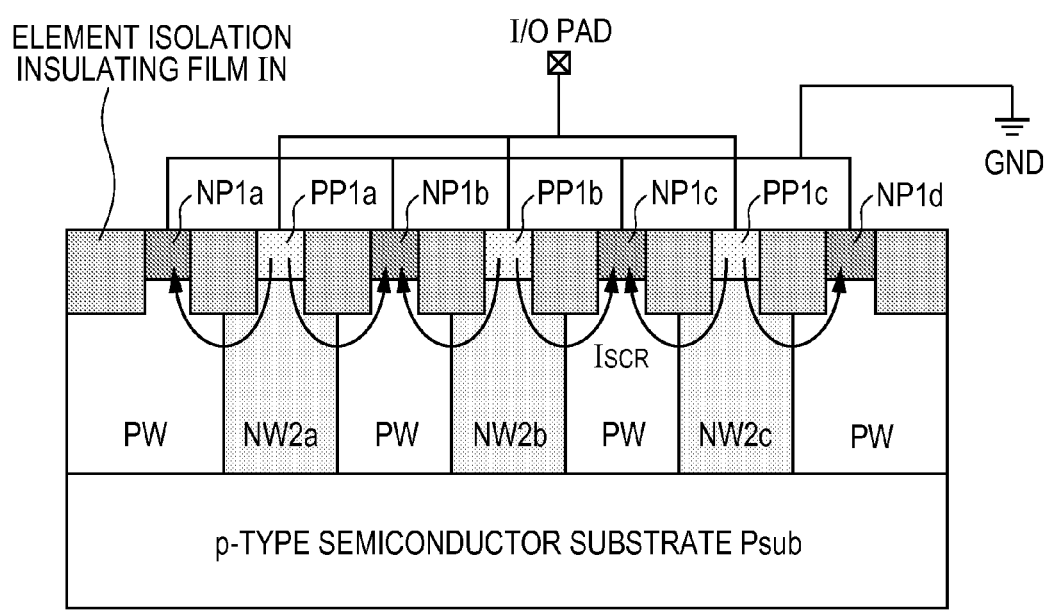
FIG. 2 is a sectional view showing the structure of the electrostatic protection circuit in the semiconductor device according to the first embodiment.

FIG. 2 is a sectional view showing the structure of the electrostatic protection circuit in the semiconductor device according to this embodiment. FIG. 2 is a sectional view taken along the dashed-dotted line AA' in the layout diagram of FIG. 1. Referring to FIG. 2, a P-type well PW and N-type wells NW2a to NW2c are formed over a P-type semiconductor substrate $P_{sub}$. High-concentration N-type regions NP1a to NP1d as SCR cathodes are formed over the surface of the P-type well PW. Also, high-concentration P-type regions PP1a to PP1c as SCR anodes are formed over the surfaces of the N-type wells NW2a to NW2c respectively. Element isolation insulating film IN separates the high-concentration N-type regions from the high-concentration P-type regions.

The high-concentration P-type regions PP1a to PP1c are coupled to an I/O pad. On the other hand, high-concentration N-type regions NP1a to NP1d are coupled to the grounding potential.

Figure 3:
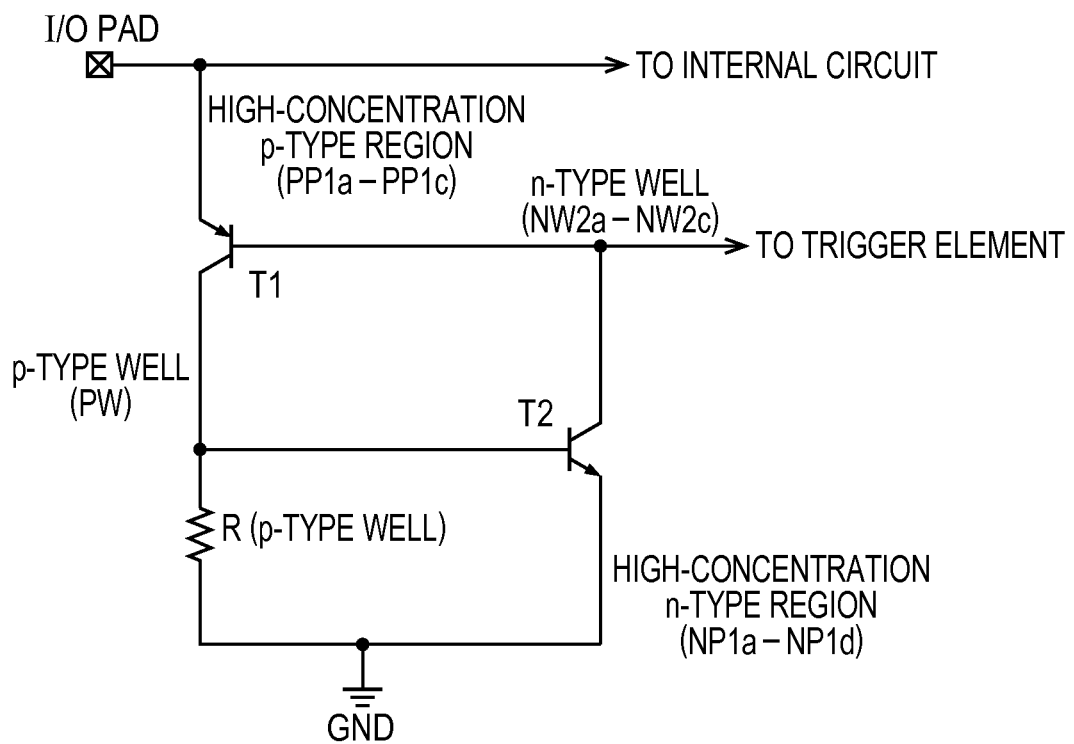
FIG. 3 is a circuit diagram showing the equivalent circuit of the electrostatic protection circuit in the semiconductor device according to the first embodiment.

FIG. 3 is a circuit diagram showing the equivalent circuit of the electrostatic protection circuit shown in FIGS. 1 and 2. Referring to FIGS. 1 and 3, the high-concentration P-type regions PP1a to PP1c, N-type wells NW2a to NW2c, and P-type well PW make up a PNP transistor T1. Also, the high-concentration N-type regions NP1a to NP1d, P-type well PW, and N-type wells NW2a to NW2c make up an NPN transistor T2. The PNP transistor T1 and NPN transistor T2 together make up a thyristor element. Here, the high-concentration P-type regions PP1a to PP1c correspond to thyristor anode electrodes and the high-concentration N-type regions NP1a to NP1d correspond to thyristor cathode electrodes, and the high-concentration N-type region NP2 formed on the surface of the N-type well NW1 corresponds to a thyristor trigger electrode.

In the electrostatic protection circuit shown in FIGS. 1 to 3, when a voltage higher than a given level is applied to the trigger element (not shown), trigger current $I_{trig}$ flows from the I/O pad through the high-concentration P-type regions PP1a to PP1c and N-type wells NW2a to NW2c and flows in the second direction to the high-concentration N-type region NP2 as indicated by the dotted line arrows 16 in FIG. 1. Since the trigger current $I_{trig}$ corresponds to the base current of the PNP transistor T1, as the base current flows, the PNP transistor T1 turns on, causing a collector current to flow in the PNP transistor T1. As the collector current flows in the PNP transistor T1, a voltage drop occurs in the resistance portion R (P-type well) inside the P-type well PW. This causes a forward bias between the base and emitter of the NPN transistor T2, which turns on the NPN transistor T2. As the thyristor element, comprised of the transistors T1 and T2, turns on as mentioned above, SCR current $I_{SCR}$ flows from each SCR anode in the first direction to the SCR cathodes located on both sides of it. Referring to FIGS. 1 and 2, SCR current $I_{SCR}$ flows from the high-concentration P-type regions PP1a to PP1c to the high-concentration N-type regions NP1a to NP1d located on both sides of them as indicated by the solid line arrows 15. Thus, the electrostatic protection circuit has layout out such that the SCR current $I_{SCR}$ is configured to flow from an SCR anode to an SCR cathode in the first direction, while the trigger current $I_{trip}$ is configured to flow from an SCR anode to a trigger tap in a second direction which is different from (e.g., perpendicular to) the first direction. This contrasts with the layout of the prior art electrostatic protection circuit seen in FIG. 7 in which the SCR current $I_{SCR}$ and trigger current $I_{trig}$ flow in the same direction (the horizontal direction in FIG. 7).

According to the semiconductor device described in Japanese Patent No. 4312696, the trigger TAP (high-concentration N-type region NP11) is located in the center, so at most two thyristor elements can be operated. The inventors came up with the layout (FIG. 1) in this embodiment, focusing attention on the fact that the trigger TAP is not required after the thyristor element turns on and the SCR current $I_{SCR}$ begins to flow. According to the semiconductor device in this embodiment, the adoption of the layout shown in FIG. 1 makes it possible that SCR cathodes are located on both sides of each SCR anode and thus the thyristor element effective width (W) per SCR anode can be increased and the discharge capacity per unit area of the thyristor element can be improved. Referring to FIGS. 1 and 2, according to this embodiment, six thyristor elements, each comprised of one of three SCR anodes and one of two adjacent SCR cathodes, can be operated at the same time, permitting efficient discharge of the ESD current.

According to this embodiment, the long side dimension and the numbers of SCR anodes and SCR cathodes can be adjusted as desired without sacrificing the thyristor element performance, so the freedom in the layout design of the electrostatic protection circuit can be substantially improved.

Furthermore, according to this embodiment, the area of the electrostatic protection circuit can be substantially reduced as compared with the technique described in Japanese Patent No. 4312696. This will be concretely explained below by taking an example on the assumption that the thyristor element effective width W is designed to be 100 μm (W=100 μm). It is also assumed here that the short side of each of the SCR anodes, SCR cathodes and trigger TAP is 2 μm. The interval between an SCR anode (cathode) and a neighboring SCR cathode (anode) and the interval between an SCR anode (cathode) and a neighboring trigger TAP are assumed to be all 0.5 μm. The distance from the SCR anodes, SCR cathodes and trigger TAP to the SCR element periphery is assumed to be 1.5 μm.

Figure 7:
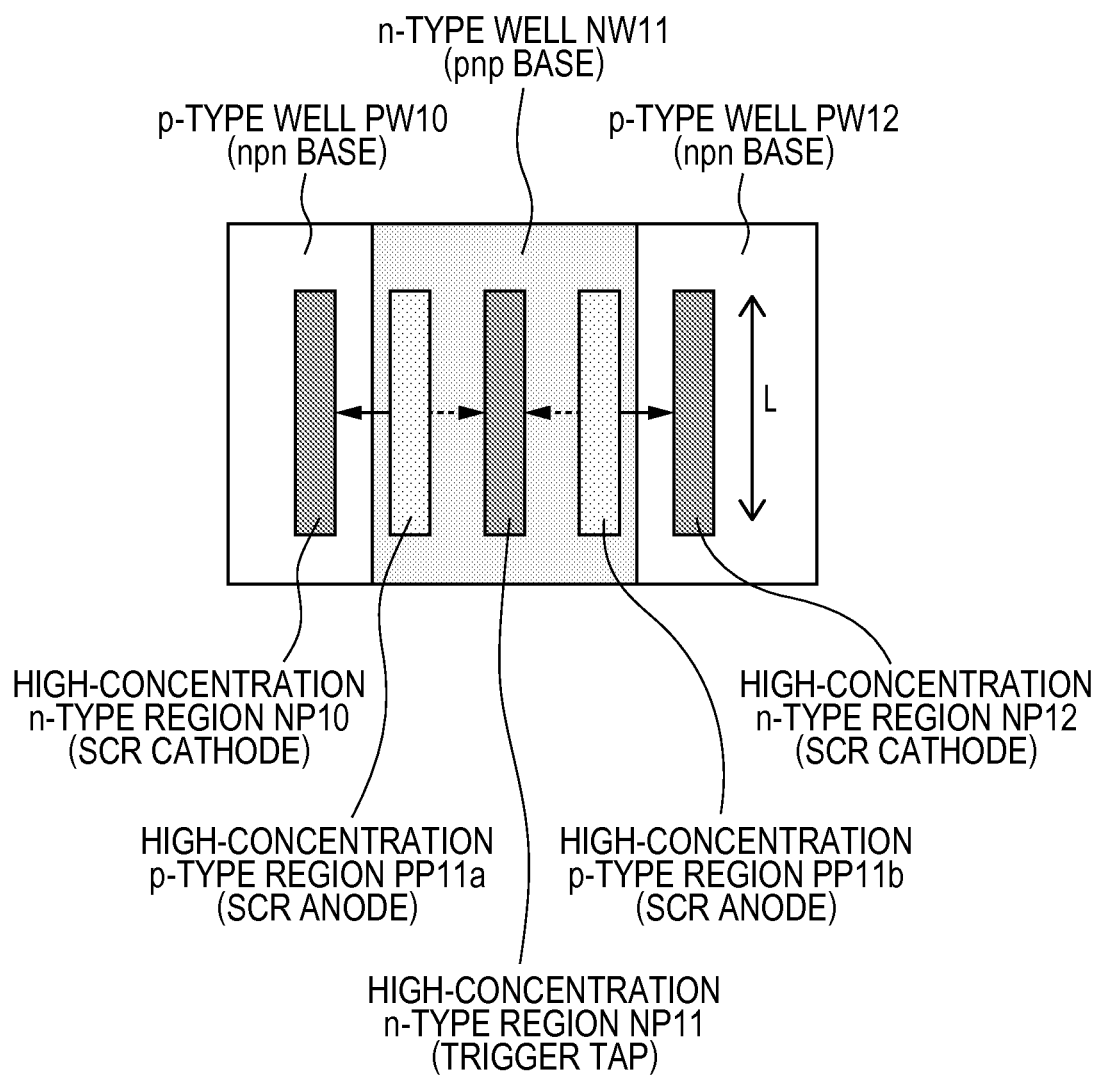
FIG. 7 is a plan view showing the layout of the electrostatic protection circuit in the semiconductor device described in Japanese Patent No. 4312696.

According to the semiconductor device described in Japanese Patent No. 4312696, as shown in FIG. 7, two SCR anodes and two SCR cathodes and one trigger TAP are provided, so in order to obtain an SCR element effective width of 120 μm (W=120 μm), the long side length L of each of the SCR anodes, SCR cathodes, and trigger TAP must be 60 μm (L=W/2=60 μm). Therefore, the SCR anodes, SCR cathodes, and trigger TAP should be each a rectangle with a long side of 60 μm and a short side of 2 μm. In this case, the layout area is calculated as follows: 63 μm (vertical)×15 μm (horizontal) =945 μm².

On the other hand, according to the semiconductor device in this embodiment, as shown in FIG. 1, three SCR anodes and four SCR cathodes are provided, so in order to obtain an SCR element effective width of 120 μm (W=120 μm), the long side length L of each of the SCR anodes, SCR cathodes, and trigger TAP must be 20 μm (L=W/6=20 μm). Therefore, the SCR anodes and SCR cathodes should be each a rectangle with a long side of 20 μm and a short side of 2 μm. In this case, the layout area is calculated as follows: 25.5 μm (vertical)×20 μm (horizontal)=510 μm².

Therefore, in the semiconductor device in this embodiment, the layout area of the electrostatic protection circuit is 46% smaller than in the semiconductor device described in Japanese Patent No. 4312696 (46%=(945−510)/945). Although the reduction of the layout area has been explained above based on concrete numerical values, it should be noted that according to this embodiment, the layout area of the electrostatic protection circuit can be reduced to about half of that in Japanese Patent No. 4312696 regardless of the numbers of SCR anodes and SCR cathodes.

Furthermore, according to the semiconductor device in this embodiment, the number of SCR anodes and the number of SCR cathodes can be freely adjusted while the element performance of the electrostatic protection circuit and its layout area are kept constant. Therefore, according to this embodiment, the aspect ratio of the electrostatic protection circuit can be adjusted as desired and the freedom in the layout design of the electrostatic protection circuit is substantially increased.

Second Embodiment

The semiconductor device according to the second embodiment will be described referring to drawings. FIG. 4 is a plan view showing the layout of the electrostatic protection circuit in the semiconductor device according to this embodiment. Referring to FIG. 4, the electrostatic protection circuit in this embodiment includes a high-concentration P-type region PP2 as a trigger TAP for NPN (second trigger TAP) in addition to what is included in the electrostatic protection circuit in the semiconductor device according to the first embodiment (FIG. 1). The high-concentration P-type region PP2 extends in a direction perpendicular to the long side direction of the SCR anodes in a way to face, and extend parallel to, the trigger TAP for PNP (high-concentration N-type region NP2) (first trigger TAP) and sandwich the region where the SCR anodes and SCR cathodes are located.

In the electrostatic protection circuit shown in FIG. 4, when a voltage higher than a given level is applied to the trigger element (not shown), trigger current $I_{trig}$ flows from the high-concentration P-type regions PP1a to PP1c through the N-type wells NW2a to NW2c to the high-concentration N-type region NP2 as indicated by the first set of dotted line arrows 16 in FIG. 4. Also, trigger current $t_{trig}$ flows from the high-concentration P-type region PP2 through the P-type well PW to the high-concentration N-type regions NP1a to NP1d, as indicated by another set of dotted line arrows 42.

As shown in FIG. 4, the PNP trigger TAP (high-concentration N-type region NP2) and NPN trigger TAP (high-concentration P-type region PP2) extend parallel to each other and are symmetrically arranged with the SCR anodes and SCR cathodes between them, so the turn-on operation of the thyristor element is uniform in the long side direction of the SCR anodes (vertical direction in FIG. 4). Consequently, according to this embodiment, since the thyristor element turns on uniformly, the performance of the electrostatic protection circuit as an ESD protection device is higher than in the first embodiment.

The inventors evaluated the electrostatic protection circuit according to this embodiment which was produced experimentally using 40 nm CMOS technology and confirmed that it achieves an electrostatic breakdown voltage of 4000 V or more when its layout area is 400 $\mu m^2$ (HBM (Human Body Model) electrostatic discharge (ESD) test).

Third Embodiment

The semiconductor device according to the third embodiment will be described referring to drawings. FIG. 5 is a plan view showing the layout of the electrostatic protection circuit in the semiconductor device according to this embodiment. Referring to FIG. 5, the electrostatic protection circuit has a vertically symmetrical structure which is obtained by minoring the electrostatic protection circuit of the semiconductor device in the first embodiment with respect to the centerline P1 of the high-concentration N-type region NP2 in the long side direction as the minor axis of symmetry. In the electrostatic protection circuit in this embodiment, the N-type wells (PNP base) which include N-type wells NW1, NW2a to NW2c, and NW3a to NW3c are arranged in a fishbone pattern. High-concentration P-type regions PP3a to PP3c are formed on the surfaces of the N-type wells NW3a to NW3c respectively. Also, high-concentration N-type regions NP3a to NP3d as SCR cathodes are formed on the surface of the P-type well PW on both sides of each SCR anode.

In the electrostatic protection circuit in this embodiment, trigger current $I_{trig}$ for the PNP transistor T1 flows from the high-concentration P-type regions PP1a to PP1c through the N-type wells NW2a to NW2c to the high-concentration N-type region NP2 formed on the surface of the N-type well NW1 as indicated by the first set of dotted line arrows 16 in FIG. 5. Also, trigger current $I_{trig}$ flows from the high-concentration P-type regions PP3a to PP3c through the N-type wells NW3a to NW3c to the high-concentration N-type region NP2 formed on the surface of the N-type well NW1, as indicated by the second set of dotted line arrows 18 in FIG. 5.

Therefore, according to the semiconductor device in this embodiment, the high-concentration N-type region NP2 formed as a trigger TAP is shared by six thyristor elements formed above the N-type well NW1 as seen in FIG. 5 and six thyristor elements formed below the N-type well NW1 as seen in FIG. 5, or a total of twelve thyristor elements.

According to this embodiment, the vertical dimension of the electrostatic protection circuit can be smaller than when the layout of the electrostatic protection circuit (FIG. 1) in the semiconductor device according to the first embodiment is repeated in parallel in the vertical direction in FIG. 1. Although the vertically symmetrical layout of the electrostatic protection circuit is shown as an example in FIG. 5, the layout of the electrostatic protection circuit in this embodiment is not limited to what is shown in FIG. 5. For example, in the electrostatic protection circuit, the N-type wells NW3a to NW3c and the N-type wells NW2a to NW2c may be coupled to the N-type well NW1 at different positions in the horizontal direction. Also, the number of N-type wells coupled to the upper long side 10 of the N-type well NW1 may be different from the number of N-type wells coupled to the lower long side 12 of the N-type well NW1.

Fourth Embodiment

The semiconductor device according to the fourth embodiment will be described referring to drawings. FIG. 6 is a plan view showing the layout of the electrostatic protection circuit in the semiconductor device according to this embodiment. Referring to FIG. 6, the electrostatic protection circuit in this embodiment has a vertically symmetrical structure which is obtained by mirroring the electrostatic protection circuit (FIG. 4) of the semiconductor device in the second embodiment with respect to the centerline P2 of the high-concentration N-type region NP2 in the long side direction as the axis of symmetry.

In the electrostatic protection circuit shown in FIG. 6, when a voltage higher than a given level is applied to the trigger element (not shown), trigger current $I_{trig}$ flows from the high-concentration P-type regions PP1a to PP1c through the N-type wells NW2a to NW2c to the high-concentration N-type region NP2 as indicated by the first set of dotted line arrows 16 in FIG. 6. Also, trigger current $I_{trig}$ flows from the high-concentration P-type regions PP3a to PP3c through the N-type wells NW3a to NW3c to the high-concentration N-type region NP2, as indicated by the second set of dotted line arrows 18. Furthermore, trigger current $I_{trig}$ flows from the high-concentration P-type region PP2 through the P-type well PW to the high-concentration N-type regions NP1a to NP1d, as indicated by the third set of dotted line arrows 42. Also, trigger current $I_{trig}$ flows from the high-concentration P-type region PP4 through the P-type well PW to the high-concentration N-type regions NP3a to NP3d, as indicated by the fourth set of dotted line arrows 44.

According to the semiconductor device in this embodiment, the high-concentration N-type region NP2 formed as a trigger TAP is shared by six thyristor elements formed above the N-type well NW1 and six thyristor elements formed below the N-type well NW1, or a total of twelve thyristor elements.

Therefore, according to this embodiment, the vertical dimension of the electrostatic protection circuit can be smaller than when the layout of the electrostatic protection circuit (FIG. 4) in the semiconductor device according to the second embodiment is repeated in parallel in the vertical direction in FIG. 4. Although the vertically symmetrical layout of the electrostatic protection circuit is shown as an example in FIG. 6, the layout of the electrostatic protection circuit in this embodiment is not limited to what is shown in FIG. 6. For example, in the electrostatic protection circuit, the N-type wells NW3a to NW3c and the N-type wells NW2a to NW2c may be coupled to the N-type well NW1 at different positions along the horizontal direction. Also, the number of N-type wells coupled to the upper long side 10 of the N-type well NW1 may be different from the number of N-type wells coupled to the lower long side 12 of the N-type well NW1.

And referring to both FIGS. 5 and 6, below the n-type well NW1, the SCR current $I_{SCR}$ flows from the high-concentration P-type regions PP1a to PP1c to the high-concentration N-type regions NP1a to NP1d, as indicated by solid arrows 15. Similarly, above the n-type well NW1, the SCR current $I_{SCR}$ flows from the high-concentration P-type regions PP3a to PP3c to the high-concentration N-type regions NP3a to NP3d, as indicated by solid arrows 17.

The disclosure of the above patent literature is incorporated herein by reference. Changes and modifications of the embodiments may be made within the framework of the entire disclosure (including the claims) of the present invention and on the basis of its basic technical idea. A variety of combinations or selections of various disclosure elements (including the elements of the claims, the elements of the embodiments, and the elements of the drawings) are possible within the framework of the claims of the present invention. In other words, it is obvious that the present invention includes many kinds of variation and alteration which those skilled in the art would be able to make in accordance with the entire disclosure including the claims and its technical idea.

What is claimed is:

1. A semiconductor electrostatic protection circuit device, comprising:
    a first first-conductivity type well extending in a first direction over a semiconductor substrate of the semiconductor electrostatic protection circuit device, the first first-conductivity type well having a first long side and a second long side opposite the first long side;
    at least one second first-conductivity type well extending in a second direction over the semiconductor substrate and perpendicular to the first direction with one end coupled to the second long side of the first first-conductivity type well;
    a second-conductivity type well formed over the substrate and enclosing the first first-conductivity type well and the at least one second first-conductivity type well;
    at least one first high-concentration second-conductivity type region extending in the second direction on a surface of the second first-conductivity type well; and
    at least one first high-concentration first-conductivity type region extending in the second direction on a surface of the second-conductivity type well, the first high-concentration first-conductivity type region facing the first high-concentration second-conductivity type region.

2. The semiconductor electrostatic protection circuit device according to claim 1, further comprising:
    a second high-concentration first-conductivity type region extending in the first direction as a first trigger tap region on a surface of the first first-conductivity type well.

3. The semiconductor electrostatic protection circuit device according to claim 2, comprising:
    a plurality of the at least one second first-conductivity type well,
    a plurality of the at least one first high-concentration second-conductivity type region, and
    a plurality of the at least one first high-concentration first-conductivity type region.

4. The semiconductor electrostatic protection circuit device according to claim 3, further comprising:
    a second high-concentration second-conductivity type region extending in the first direction as a second trigger tap region on the surface of the second-conductivity type well, the second high-concentration second-conductivity type region facing the second high-concentration first-conductivity type region with the second first-conductivity type wells sandwiched therebetween.

5. The semiconductor electrostatic protection circuit device according to claim 3, having a layout such that each of the first high-concentration second conductivity type regions has:
    a long side which faces a long side of at least one of the first high-concentration first-conductivity type regions; and
    a short side which faces a long side of the second high-concentration first-conductivity type region serving as the first trigger tap region.

6. The semiconductor electrostatic protection circuit device according to claim 2, further comprising:
    at least one third first-conductivity type well extending in the second direction and having one end coupled to the first long side of the first first-conductivity-type well;
    at least one third high-concentration second-conductivity type region extending in the second direction on a surface of the third first-conductivity type well; and
    at least one third high-concentration first-conductivity type region extending in the second direction on the surface of the second-conductivity type well, the third high-concentration first-conductivity type region facing the third high-concentration second-conductivity type region, wherein the second-conductivity type well is formed over the substrate and encloses the first first-conductivity type well, the at least one second first-conductivity type well, and the at least one third first-conductivity type well.

7. The semiconductor electrostatic protection circuit device according to claim 6, comprising:
    a plurality of the at least one second first-conductivity type well,
    a plurality of the at least one first high-concentration second-conductivity type region,
    a plurality of the at least one first high-concentration first-conductivity type region,
    a plurality of the at least one third first-conductivity type well,
    a plurality of the at least one third high-concentration second-conductivity type region, and
    a plurality of the at least one third high-concentration first-conductivity type region.

8. The semiconductor electrostatic protection circuit device according to claim 7, further comprising:
    a second high-concentration second-conductivity type region extending in the first direction as a second trigger tap region on the surface of the second-conductivity type well, the second high-concentration second-conductivity type region facing the second high-concentration first-conductivity type region with the second first-conductivity type wells sandwiched therebetween; and
    a fourth high-concentration second-conductivity type region extending in the first direction as a third trigger tap region on the surface of the second-conductivity type well, the fourth high-concentration second-conductivity type region facing the second high-concentration first-conductivity type region with the third first-conductivity type wells sandwiched therebetween.

9. The semiconductor electrostatic protection circuit device according to claim 6, wherein:
the first high-concentration first-conductivity type region extends parallel to, and for the same length as, the first high-concentration second-conductivity type region; and
the third high-concentration first-conductivity type region extends parallel to, and for the same length as, the third high-concentration second-conductivity type region.

10. The semiconductor electrostatic protection circuit device according to claim 2, having a layout such that:
an SCR current $I_{SCR}$ is configured to flow, along the first direction, from the first high-concentration second-conductivity type region to the first high-concentration first-conductivity type region; and
a trigger current $I_{trig}$ is configured to flow, along the second direction, from the first high-concentration second-conductivity type region to the second high-concentration first-conductivity type region.

11. The semiconductor electrostatic protection circuit device according to claim 1, wherein:
the first high-concentration first-conductivity type region extends parallel to, and for the same length as, the first high-concentration second-conductivity type region.

12. A semiconductor electrostatic protection circuit device, comprising:
a first first-conductivity type well extending in a first direction over a semiconductor substrate of the semiconductor electrostatic protection circuit device, the first first-conductivity type well having a first long side and a second long side opposite the first long side;
a plurality of second first-conductivity type wells extending in a second direction over the semiconductor substrate and perpendicular to the first direction with one end of each of the plurality of second first-conductivity type wells coupled to the second long side of the first first-conductivity type well;
a second-conductivity type well formed over the substrate and enclosing the first first-conductivity type well and the second first-conductivity type wells;
a plurality of first high-concentration second-conductivity type regions each extending in the second direction on a surface of each of the plurality of second first-conductivity type wells;
a plurality of first high-concentration first-conductivity type regions extending in the second direction on a surface of the second-conductivity type well with each of the first high-concentration second-conductivity type regions being located next to at least one of the first high-concentration first-conductivity type regions; and
a second high-concentration first-conductivity type region extending in the first direction as a first trigger tap region on a surface of the first first-conductivity type well.

13. The semiconductor electrostatic protection circuit device according to claim 12, wherein:
each of the first high-concentration second-conductivity type regions is between two of the first high-concentration first-conductivity type regions.

14. The semiconductor electrostatic protection circuit device according to claim 13, wherein:
each of the first high-concentration second-conductivity type regions has a long side which faces, and extends parallel to, two of said plurality of first high-concentration first-conductivity type regions.

15. The semiconductor electrostatic protection circuit device according to claim 12, having a layout such that:

an SCR current $I_{SCR}$ is configured to flow, along the first direction, from each of the first high-concentration second-conductivity type regions to at least one of the first high-concentration first-conductivity type regions; and
a trigger current $I_{trig}$ is configured to flow, along the second direction, from each of the first high-concentration second-conductivity type regions to the second high-concentration first-conductivity type region.

16. The semiconductor electrostatic protection circuit device according to claim 12, wherein:
the device has mirror symmetry about a line extending in the first direction through the first first-conductivity type well and the second high-concentration first-conductivity type region.

17. The semiconductor electrostatic protection circuit device according to claim 16, having a layout such that:
an SCR current $I_{SCR}$ is configured to flow, along the first direction, from each of the first high-concentration second-conductivity type regions to at least one of the first high-concentration first-conductivity type regions; and
a trigger current $I_{trig}$ is configured to flow, along the second direction, from each of the first high-concentration second-conductivity type regions to the second high-concentration first-conductivity type region.

18. The semiconductor electrostatic protection circuit device according to claim 12, further comprising:
a second high-concentration second-conductivity type region extending in the first direction as a second trigger tap region on the surface of the second-conductivity type well, the second high-concentration second-conductivity type region facing the second high-concentration first-conductivity type region with the second first-conductivity type wells sandwiched therebetween.

19. The semiconductor electrostatic protection circuit device according to claim 18, wherein:
the device has mirror symmetry about a line extending in the first direction through the first first-conductivity type well and the second high-concentration first-conductivity type region.

20. The semiconductor electrostatic protection circuit device according to claim 19, having a layout such that:
an SCR current $I_{SCR}$ is configured to flow, along the first direction, from each of the first high-concentration second-conductivity type regions to at least one of the first high-concentration first-conductivity type regions; and
a trigger current $I_{trig}$ is configured to flow, along the second direction, from each of the first high-concentration second-conductivity type regions to the second high-concentration first-conductivity type region.

21. A semiconductor electrostatic protection circuit device, comprising:
a first first-conductivity type well extending in a first direction over a semiconductor substrate of the semiconductor electrostatic protection circuit device, the first first-conductivity type well having a first long side and a second long side opposite the first long side;
a plurality of first high-concentration second-conductivity type regions extending in a second direction perpendicular to the first direction over the semiconductor substrate;
a plurality of first high-concentration first-conductivity type regions extending in the second direction over the semiconductor substrate and facing at least one of the plurality of first high-concentration second-conductivity type regions;

a second high-concentration first-conductivity type region extending in the first direction as a first trigger tap region on a surface of the first first-conductivity type well; and a second-conductivity type well formed over the substrate and enclosing the first first-conductivity type well and also the first high-concentration first-conductivity type regions;

wherein the electrostatic protection circuit device has a layout such that each of the first high-concentration second conductivity type regions has:

a long side which faces a long side of at least one of the first high-concentration first-conductivity type regions; and a short side which faces a long side of the second high-concentration first-conductivity type region serving as the first trigger tap region.

22. The semiconductor electrostatic protection circuit device according to claim 21, having the layout such that:

an SCR current $I_{SCR}$ is configured to flow, along the first direction, from each of the first high-concentration second-conductivity type regions to at least one of the first high-concentration first-conductivity type regions; and a trigger current $I_{trig}$ is configured to flow, along a second direction different from the first direction, from each of the first high-concentration second-conductivity type regions to the second high-concentration first-conductivity type region serving as first trigger tap region.

* * * * *